(12) United States Patent
Byun

(10) Patent No.: US 7,298,660 B2
(45) Date of Patent: Nov. 20, 2007

(54) BIT LINE SENSE AMPLIFIER CONTROL CIRCUIT

(75) Inventor: Hee Jin Byun, Gyeonggi-do (KR)

(73) Assignee: Hynix Semiconductor Inc., Icheon-Si (KR)

( * ) Notice: Subject to any disclaimer, the term of this patent is extended or adjusted under 35 U.S.C. 154(b) by 0 days.

(21) Appl. No.: 11/604,764

(22) Filed: Nov. 28, 2006

(65) Prior Publication Data

US 2007/0070751 A1    Mar. 29, 2007

Related U.S. Application Data

(63) Continuation of application No. 11/152,111, filed on Jun. 15, 2005, now Pat. No. 7,158,430.

(30) Foreign Application Priority Data

Aug. 26, 2004  (KR) .................... 10-2004-0067374

(51) Int. Cl.
*G11C 7/00*  (2006.01)
(52) U.S. Cl. .................. 365/205; 365/207; 365/222; 327/51
(58) Field of Classification Search ............. 365/205, 365/207, 222; 327/51
See application file for complete search history.

(56) References Cited

U.S. PATENT DOCUMENTS

| | | | |
|---|---|---|---|
| 6,344,760 B1 | 2/2002 | Pyo | |
| 6,459,639 B2 | 10/2002 | Nishimura | |
| 6,566,929 B2 | 5/2003 | Pyo | |
| 6,754,122 B2 * | 6/2004 | Wada et al. | ................ 365/207 |
| 6,973,002 B2 * | 12/2005 | Hara et al. | ................ 365/205 |
| 2001/0012227 A1 | 8/2001 | Nishimura | |

FOREIGN PATENT DOCUMENTS

| KR | 1999-65148 | 8/1999 |
|---|---|---|
| KR | 2001-61380 | 7/2001 |

* cited by examiner

*Primary Examiner*—Anh Phung
*Assistant Examiner*—Toan Le
(74) *Attorney, Agent, or Firm*—Townsend & Townsend & Crew LLP

(57) ABSTRACT

A bit line sense amplifier control circuit includes a driving signal generating unit adapted and configured to generate first through third driving signals in response to a bit line sense amplifier enable signal and an overdrive enable signal for setting an overdrive period, and to disable a first driving signal which is enabled for an overdrive period in response to a refresh signal which is enabled at a refresh mode, and a bit line sense amplifier control signal generating unit adapted and configured to generate first and second bit line sense amplifier control signals in response to the first through third driving signals. As a result, an overdrive pulse is not generated at a refresh mode to remove an overdriving period, thereby reducing current consumption at a refresh mode.

12 Claims, 5 Drawing Sheets

BIT LINE SENSE AMPLIFIER CONTROL CIRCUIT

CORRESPONDING RELATED APPLICATION

This application is a continuation of U.S. application Ser. No. 11/152,111 filed Jun. 15, 2005 now U.S. Pat. No. 7,158,430, which claims priority to Korean Patent Application No. 10-2004-0067374 filed Aug. 26, 2004, which are hereby incorporated by reference in their entirety.

BACKGROUND OF THE INVENTION

1. Field of the Invention

The present invention generally relates to a bit line sense amplifier control circuit of a semiconductor memory device, and more specifically, to a technology of removing an overdriving period at a refresh mode, thereby reducing current consumption at a self-refresh mode.

2. Description of the Related Art

Generally, a bit line sense amplifier senses and amplifies data on a bit line to output the data to a data bus, and a data bus sense amplifier re-senses and re-amplifies the data amplified by the bit line sense amplifier to output the data to a data output buffer.

The operation of the general bit line sense amplifier is described as follows. Here, a cross coupled latch type amplifier is exemplified for the bit line sense amplifier.

First, a bit line is precharged to a precharge voltage (for example, half of an internal power voltage VDD). Here, two bit lines are equalized to remove a voltage difference between one bit line connected to a selected memory cell and another bit line which is not connected to the selected memory cell.

A row decoder decodes an externally inputted row address to select a word line corresponding to the row address.

Then, a cell transistor connected to the selected word line is turned on.

As a result, a potential difference is generated between one bit line connected to a selected memory cell and another bit line which is not connected to the selected memory cell by charge sharing between cell capacitance and bit line capacitance.

Here, when sense amplifier control signals RTO and SB are enabled, the sense amplifier control signal RTO becomes at a high level VDD, and the sense amplifier control signal SB becomes at a low level VSS. As a result, a bit line sense amplifier is operated to amplify the potential difference between the bit line connected to the selected memory cell and another bit line which is not connected to the selected memory cell.

For example, suppose that data stored in the selected memory cell is low level data. A potential of the bit line connected to the selected memory cell becomes lower than that of a precharge voltage, and a potential of the bit line which is not connected to the selected memory cell is maintained at that of the precharge voltage, so that a potential difference occurs between the two bit lines.

Therefore, the bit line sense amplifier which is a cross coupled latch type amplifier sets the bit line connected to the selected memory cell at the low level VSS by the low level bit line sense amplifier control signal SB, and sets the bit line which is not connected to the selected cell at the high level VDD by the high level bit line sense amplifier control signal RTO.

Thereafter, a column address is decoded by a column decoder. When a column control signal YI corresponding to the column address is enabled to a high level, data on the bit line is amplified by the bit line sense amplifier and transmitted into a data bus.

The control signal RTO for driving the bit line sense amplifier is driven as an external power voltage VEXT at the initial amplification operation in order to improve an operating speed of the bit line sense amplifier, thereby reducing a skew. At a normal mode, the control signal RTO is driven to an internal power voltage (core voltage) VCORE or an internal circuit supply voltage VPERI.

In case of a low power semiconductor memory device, a method for reducing current consumption is more preferably used than a method for improving an operating speed at a self-refresh mode. However, the current consumption is increased because the bit line sense amplifier control signal RTO is driven to the external power voltage VEXT higher than the internal power voltage VCORE which is a target voltage for an overdriving period.

SUMMARY OF THE INVENTION

Accordingly, it is an object of the present invention to remove an overdriving period at a refresh mode, thereby reducing current consumption.

According to one embodiment of the present invention, a bit line sense amplifier control circuit comprises a driving signal generating unit adapted and configured to generate first through third driving signals in response to a bit line sense amplifier enable signal and an overdrive enable signal for setting an overdrive period and to disable the first driving signal which is enabled for an overdrive period in response to a refresh signal which is enabled at a refresh mode, and a bit line sense amplifier control signal generating unit adapted and configured to generate a first bit line sense amplifier control signal and a second bit line sense amplifier control signal in response to the first through third driving signals.

BRIEF DESCRIPTION OF THE DRAWINGS

Other aspects and advantages of the present invention will become apparent upon reading the following detailed description and upon reference to the drawings in which.

DETAILED DESCRIPTION OF THE EXEMPLARY EMBODIMENTS

The present invention will be described in detail with reference to the accompanying drawings. Wherever possible, the same reference numbers will be used throughout the drawings to refer to the same or like parts.

Figure 1:
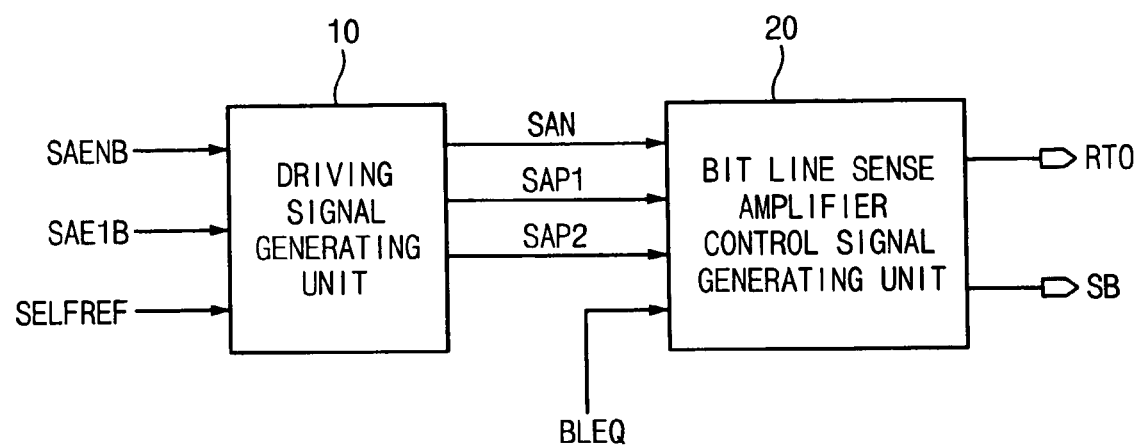
FIG. 1 is a block diagram illustrating a bit line sense amplifier control circuit according to an embodiment of the present invention.

FIG. 1 is a block diagram illustrating a bit line sense amplifier control circuit according to an embodiment of the present invention.

In this embodiment, a bit line sense amplifier control circuit comprises a driving signal generating unit 10 and a bit line sense amplifier control signal generating unit 20.

The driving signal generating unit 10 generates driving signals SAP1 and SAP2 for driving a bit line sense amplifier control signal RTO and a driving signal SAN for driving a bit line sense amplifier control signal SB in response to a sense amplifier enable signal SAENB, an overdrive enable signal SAE1B having a pulse width to determine an overdriving period and a self-refresh signal SELFREF.

The bit line sense amplifier control signal generating unit 20 generates bit line sense amplifier control signals RTO and SB in response to the driving signals SAN, SAP1 and SAP2 and a bit line equalizing signal BLEQ.

Figure 2:
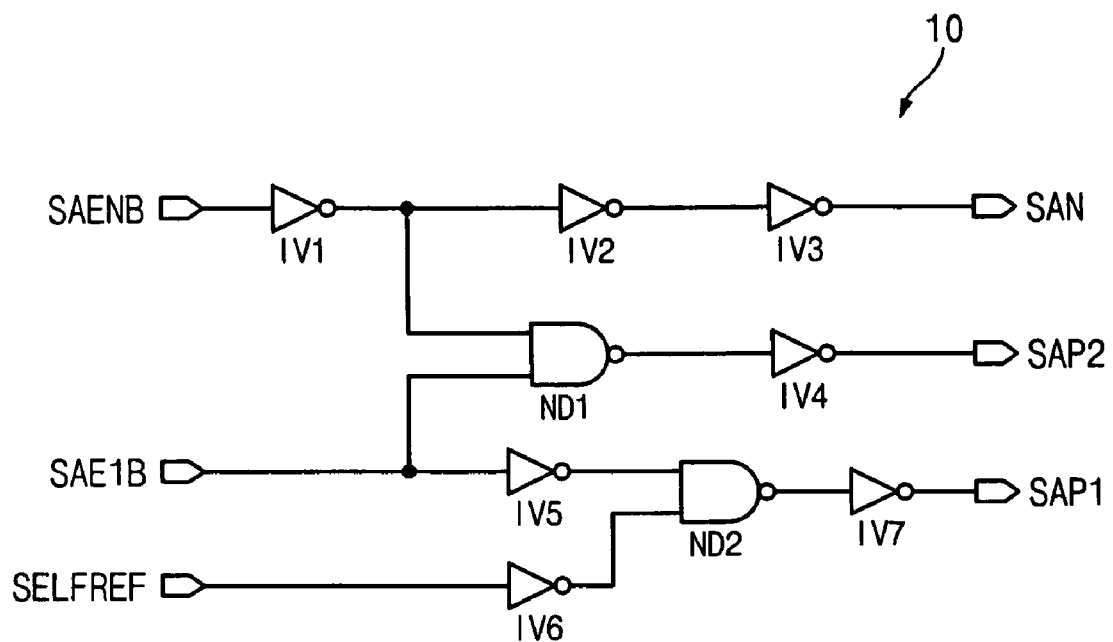
FIG. 2 is a circuit diagram illustrating a driving signal generating unit of FIG. 1.

FIG. 2 is a circuit diagram illustrating the driving signal generating unit 10 of FIG. 1.

The driving signal generating unit 10 comprises inverters IV1~IV7, and NAND gates ND1 and ND2.

The inverters IV1, IV2 and IV3 sequentially invert the bit line sense amplifier enable signal SAENB to generate the low level driving signal SAN.

The NAND gate ND1 performs a NAND operation on an output signal from the inverter IV1 and the overdrive enable signal SAE1B. The inverter IV4 inverts an output signal from the NAND gate ND1 to generate the second high level driving signal SAP2.

The inverter IV5 inverts the overdrive enable signal SAE1B, and the inverter IV6 inverts the self-refresh signal SELFREF. The NAND gate ND2 performs a NAND operation on output signals from the inverters IV5 and IV6. The inverter IV7 inverts an output signal from the NAND gate ND2 to generate the first high level driving signal SAP1. As a result, a self-refresh mode is entered, and the first high level driving signal SAP1 is maintained at a low level when the self-refresh signal SELFREF is enabled to a high level, so that an overdrive operation is not performed.

Figure 3:
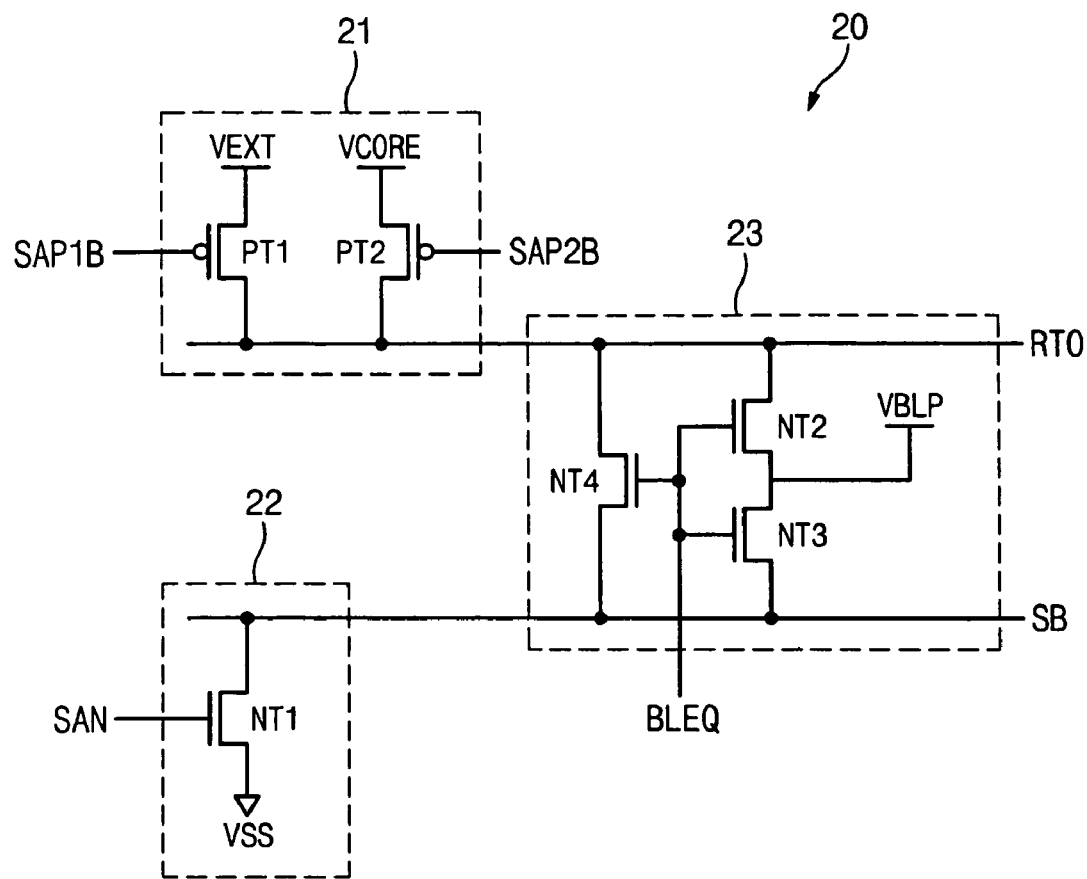
FIG. 3 is a circuit diagram illustrating a bit line sense amplifier control signal generating unit of FIG. 1.

FIG. 3 is a circuit diagram illustrating the bit line sense amplifier control signal generating unit 20 of FIG. 1.

The bit line sense amplifier control signal generating unit 20 comprises a high level bit line sense amplifier control signal driving unit 21, a low level bit line sense amplifier control signal driving unit 22 and an equalizing unit 23.

The high level bit line sense amplifier control signal driving unit 21 comprises PMOS transistors PT1 and PT2. The PMOS transistor PT1 drives the high level bit line sense amplifier control signal RTO to an external power voltage VEXT in response to the first high level driving signal SAP1B, and the PMOS transistor PT2 drives the high level bit line sense amplifier control signal RTO to a core voltage VCORE in response to the second high level driving signal SAP2B.

The low level bit line sense amplifier control signal driving unit 22 comprises a NMOS transistor NT1 which drives the low level bit line sense amplifier control signal SB to a ground voltage VSS in response to a low level driving signal SAN.

The equalizing unit 23 comprises NMOS transistors NT2, NT3 and NT4. The NMOS transistors NT2 and NT3 precharge the bit line sense amplifier control signals RTO and SB to a bit line precharge voltage VBLP in response to the bit line equalizing signal BLEQ. The NMOS transistor NT4 equalizes the bit line sense amplifier control signals RTO and SB in response to the bit line equalizing signal BLEQ.

Figure 4:
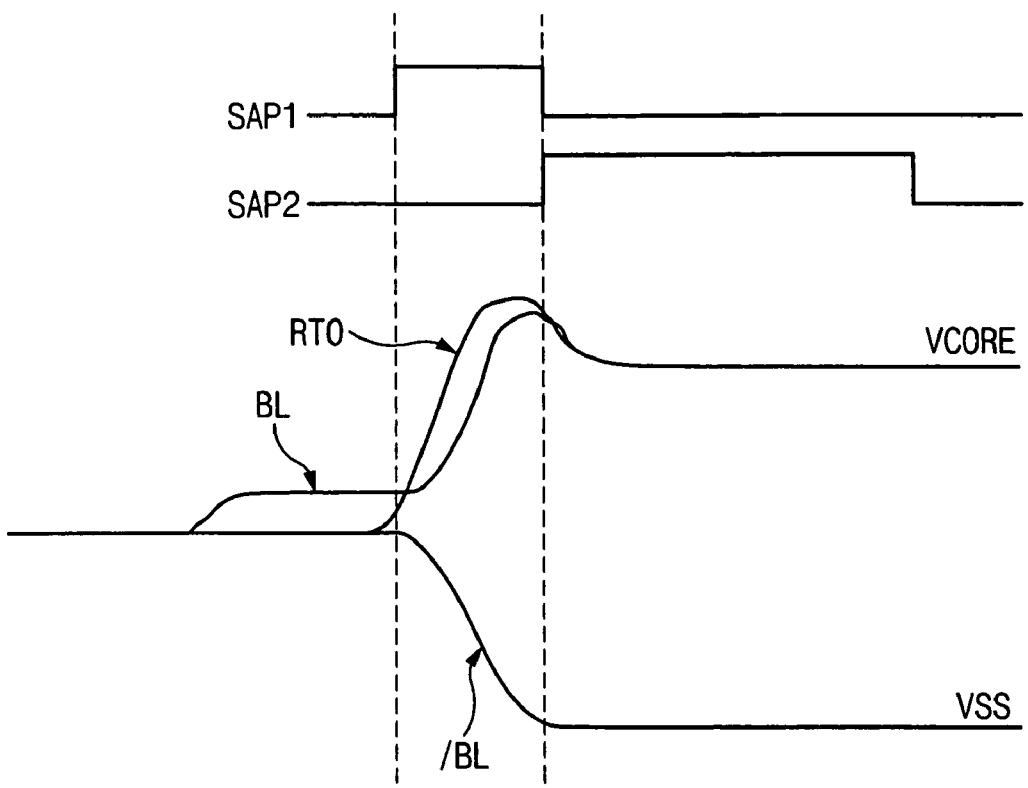
FIGS. 4 and 5 are timing diagrams illustrating the operation of the bit line sense amplifier control circuit of FIG. 1.

FIG. 4 is a timing diagram illustrating the operation of the bit line sense amplifier control circuit of FIG. 1. Here, FIG. 4 shows when an overdriving period is included at a normal mode.

While the first high level driving signal SAP1 is at a high level, the PMOS transistor PT1 of the high level bit line sense amplifier control signal driving unit 21 is turned on, so that the high level bit line sense amplifier control signal RTO is driven to the external power voltage VEXT. As a result, a potential of the bit line BL having cell data is rapidly increased.

Thereafter, the first high level driving signal SAP1 becomes at a low level, and the second high level driving signal SAP2 becomes at a high level. The PMOS transistor PT1 of the high level bit line sense amplifier control signal driving unit 21 is turned off, and the PMOS transistor PT2 is turned on. As a result, the high level bit line sense amplifier control signal RTO is driven to the core voltage VCORE, so that the potential of the bit line BL having the cell data is maintained at the core voltage VCORE.

Figure 5:
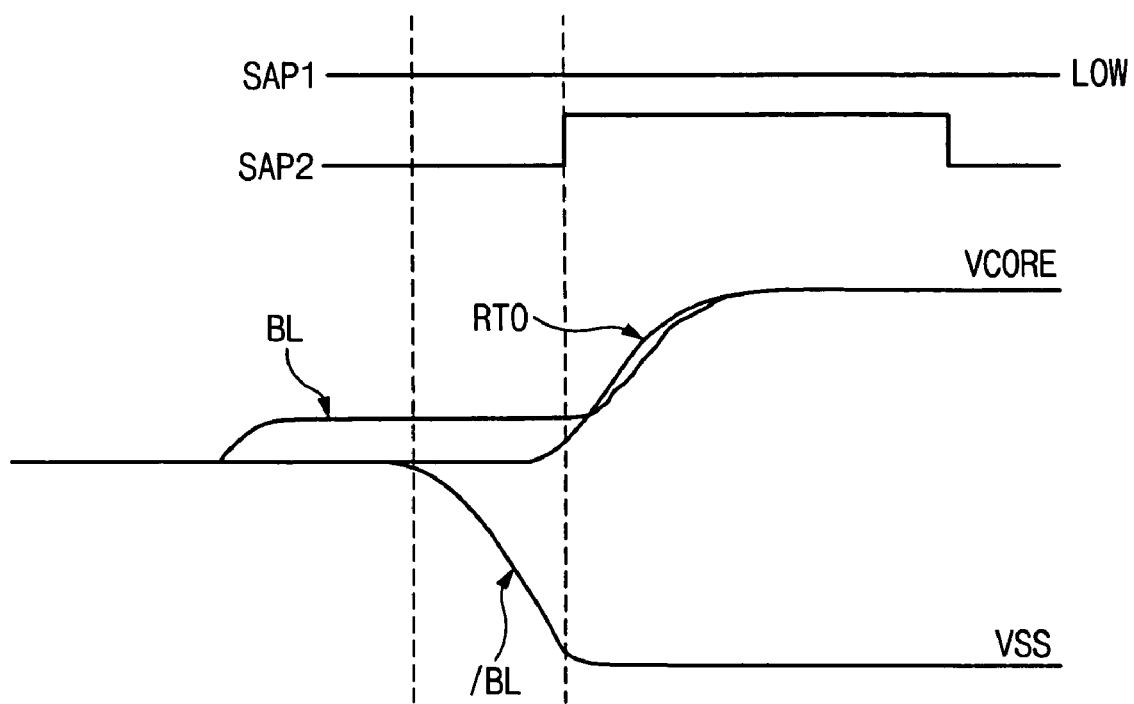

FIG. 5 is a timing diagram illustrating the operation of the bit line sense amplifier control circuit of FIG. 1. Here, FIG. 5 shows when an overdriving period is not included at a self-refresh mode.

The first high level driving signal SAP1 is maintained at the low level, and the second high level driving signal SAP2 becomes at the high level. The PMOS transistor PT1 of the high level bit line sense amplifier control signal driving unit 21 is turned off, and the PMOS transistor PT2 is turned on. As a result, the high level bit line sense amplifier control signal RTO is driven to the core voltage VCORE, so that a potential of the bit line BL having the cell data is maintained at the core voltage VCORE.

As described above, in a bit line sense amplifier control circuit according to an embodiment of the present invention, an overdriving period is removed at a refresh mode to reduce refresh current.

The foregoing description of various embodiments of the invention has been presented for purposes of illustrating and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A bit line sense amplifier control circuit comprising:
   a driving signal generating unit adapted and configured to generate a plurality of driving signals in response to a bit line sense amplifier enable signal and an overdrive enable signal, wherein the plurality of driving signals includes at least one overdrive driving signals for setting an overdrive period, wherein the overdrive driving signals are disabled when a refresh signal is enabled; and
   a bit line sense amplifier control signal generating unit adapted and configured to generate a first bit line sense amplifier control signal and a second bit line sense amplifier control signal in response to the plurality of driving signals.

2. The bit line sense amplifier control circuit according to claim 1, wherein the driving signal generating unit comprises:
   a first combination unit adapted and configured to generate the overdrive driving signals in response to the overdrive enable signal and to be disabled the overdrive driving signals when the refresh signal is enabled; and
   a second combination unit adapted and configured to generate the rest of the driving signals in response to the bit line sense amplifier enable signal.

3. The bit line sense amplifier control circuit according to claim 2, wherein the first combination unit comprises a first logic unit adapted and configured to maintain the overdrive driving signals at a predetermined level regardless of the overdrive enable signal while the refresh signal is enabled.

4. The bit line sense amplifier control circuit according to claim 2, wherein the second combination unit comprises:
a second logic unit adapted and configured to be enabled one of the rest of the driving signals when the bit line sense amplifier enable signal is enabled; and
a third logic unit adapted and configured to be enabled other of the rest of the driving signal when the bit line sense amplifier enable signal is enabled and the overdrive enable signal is disabled.

5. The bit line sense amplifier control circuit according to claim 4, wherein the third logic unit includes an AND gate.

6. The bit line sense amplifier control circuit according to claim 2, wherein the bit line sense amplifier control signal generating unit comprises:
a first driving unit adapted and configured to drive the first bit line sense amplifier control signal to a high level in response to the overdrive driving signal and the one of the rest of the driving signals; and
a second driving unit adapted and configured to drive the second bit line sense amplifier control signal to a low level in response to the other of the rest of the driving signals.

7. The bit line sense amplifier control circuit according to claim 6, wherein the bit line sense amplifier control signal generating unit further comprises a precharge unit adapted and configured to precharge and equalize the first bit line sense amplifier control signal and the second bit line sense amplifier control signal in response to a bit line equalizing signal.

8. The bit line sense amplifier control circuit according to claim 6, wherein the first driving unit comprises:
a first driving means adapted and configured to drive the first bit line sense amplifier control signal to a target voltage in response to the one of the rest of the driving signals; and
a second driving means adapted and configured to drive the first bit line sense amplifier control signal to a first power voltage higher than the target voltage in response to the overdrive driving signal.

9. The bit line sense amplifier control circuit according to claim 8, wherein the target voltage is selected from a core voltage and internal power voltages used in an internal circuit.

10. The bit line sense amplifier control circuit according to claim 8, wherein the first power voltage is an externally applied external power voltage.

11. The bit line sense amplifier control circuit according to claim 6, wherein the second driving unit comprises a third driving means adapted and configured to drive the second bit line sense amplifier control signal to a second power voltage which is a low level in response to the other of the rest of the driving signals.

12. The bit line sense amplifier control circuit according to claim 11, wherein the second power voltage is a ground voltage.

* * * * *